(12) United States Patent
Minamitani et al.

(10) Patent No.: US 12,135,173 B2
(45) Date of Patent: Nov. 5, 2024

(54) HEAT EXCHANGER

(71) Applicant: Resonac Packaging Corporation, Hikone (JP)

(72) Inventors: Koji Minamitani, Isehara (JP); Terutoshi Kumaki, Isehara (JP)

(73) Assignee: Resonac Packaging Corporation, Hikone (JP)

( * ) Notice: Subject to any disclaimer, the term of this patent is extended or adjusted under 35 U.S.C. 154(b) by 228 days.

(21) Appl. No.: 17/925,010

(22) PCT Filed: Mar. 29, 2021

(86) PCT No.: PCT/JP2021/013271
§ 371 (c)(1),
(2) Date: Nov. 14, 2022

(87) PCT Pub. No.: WO2021/229937
PCT Pub. Date: Nov. 18, 2021

(65) Prior Publication Data
US 2023/0243606 A1 Aug. 3, 2023

(30) Foreign Application Priority Data
May 14, 2020 (JP) ................................. 2020-084937

(51) Int. Cl.
*F28F 3/12* (2006.01)
*B32B 1/00* (2024.01)
(Continued)

(52) U.S. Cl.
CPC .............. *F28F 21/065* (2013.01); *B32B 1/00* (2013.01); *B32B 7/12* (2013.01); *B32B 15/08* (2013.01);
(Continued)

(58) Field of Classification Search
CPC . F28F 21/065; B23B 1/00; B32B 7/12; B32B 15/08; B32B 37/12;
(Continued)

(56) References Cited

U.S. PATENT DOCUMENTS 10,562,266 B2    2/2020  Ando et al.
2019/0386260 A1*  12/2019  Xie ..................... H01M 50/211

FOREIGN PATENT DOCUMENTS

| JP | 2014-120277 | 6/2014 |
| JP | 2020-3132 | 1/2020 |
| WO | WO 2018/116555 | 6/2018 |
| WO | WO 2018/221037 | 12/2018 |

OTHER PUBLICATIONS

Extended European Search Report for corresponding EP Application No. 21804399.0-1002, Apr. 10, 2024.
(Continued)

*Primary Examiner* — Joel M Attey
(74) *Attorney, Agent, or Firm* — MORI & WARD, LLP

(57) ABSTRACT

A heat exchanger includes an outer packaging member. The outer packaging member is configured to allow a heat transfer medium flowed to an inside of the outer packaging member from a heat transfer medium inlet to pass through the inside and flow out from a heat transfer medium outlet. The outer packaging member is made of outer packaging laminate materials each including a metal heat transfer layer and a resin thermal fusion layer provided on one surface of the heat transfer layer. The outer packaging laminate materials are superimposed one on the other. The thermal fusion layers are integrally bonded along peripheral edge portions of the outer packaging laminate materials. The heat transfer layer and the thermal fusion layer of the outer packaging laminate material are laminated via an inner adhesive agent layer made of an acid-modified polyolefin-based adhesive agent containing an acid-modified polyolefin-based resin.

6 Claims, 4 Drawing Sheets

(51) Int. Cl.
*B32B 7/12* (2006.01)
*B32B 15/08* (2006.01)
*B32B 37/12* (2006.01)
*F28F 21/06* (2006.01)
*H01M 10/613* (2014.01)
*H01M 10/625* (2014.01)
*H01M 10/6568* (2014.01)

(52) U.S. Cl.
CPC ................ *B32B 37/12* (2013.01); *F28F 3/12* (2013.01); *B32B 2037/1253* (2013.01); *H01M 10/613* (2015.04); *H01M 10/625* (2015.04); *H01M 10/6568* (2015.04); *H01M 2220/20* (2013.01)

(58) Field of Classification Search
CPC ........ B32B 2037/1253; H01M 10/613; H01M 10/625; H01M 10/6568; H01M 2220/20
USPC ....................................................... 165/166
See application file for complete search history.

(56) References Cited

OTHER PUBLICATIONS

International Search Report for corresponding International Application No. PCT/JP2021/013271, Apr. 20, 2021.
Written Opinion for corresponding International Application No. PCT/JP2021/013271, Apr. 20, 2021.

* cited by examiner

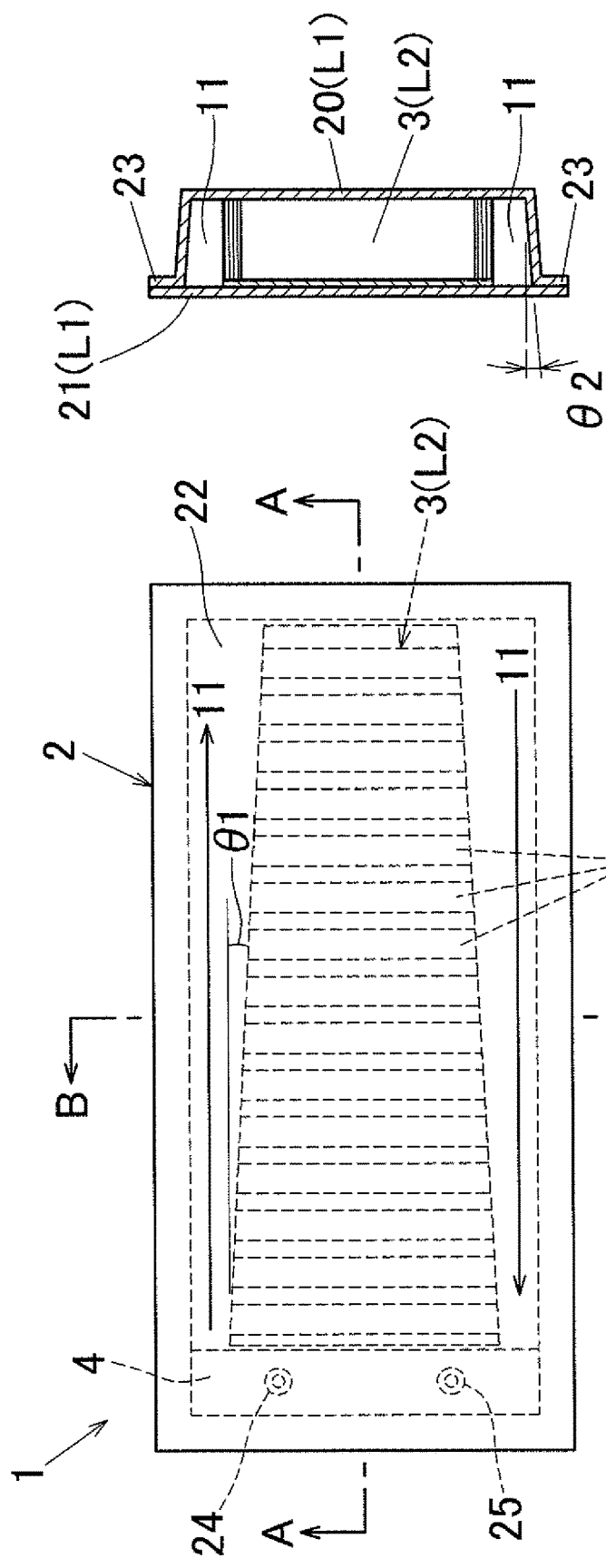
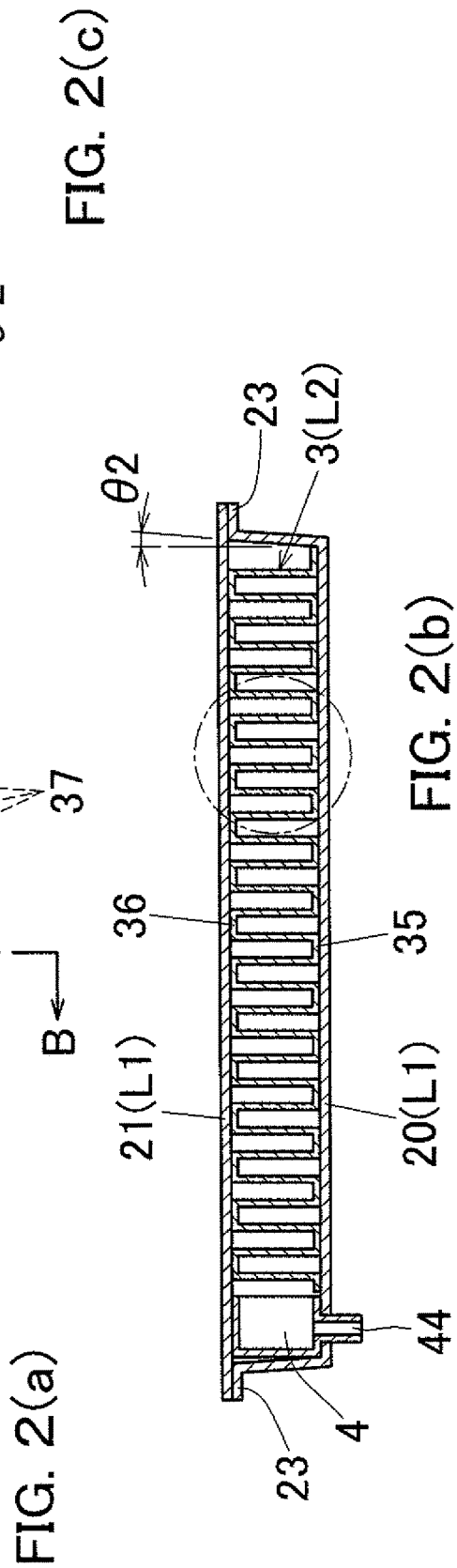
FIG. 2(a)
FIG. 2(b)
FIG. 2(c)

HEAT EXCHANGER

TECHNICAL FIELD

The present invention relates to a heat exchanger produced using a laminate material, such as, e.g., a laminate sheet, in which a resin layer is laminated on a metal layer.

BACKGROUND OF THE INVENTION

With the miniaturization and performance enhancement in electronic equipment, such as, e.g., a smartphone and a personal computer, the heat generation countermeasures for CPUs of the electronic equipment has become important. In some models, there has been proposed a technique in which a water-cooled cooling device or a heat pipe is incorporated to reduce the heat load to electronic components, such as, e.g., a CPU, and avoid the adverse effects of heat by preventing the heat buildup in the housing.

In a battery module mounted on an electric vehicle or a hybrid-powered vehicle, the heat generation of the battery pack is large due to the repeated charging and discharging. For this reason, also in the battery module, there has been proposed a technique for avoiding the adverse effects of heat by incorporating a water-cooled cooling device or a heat pipe in the same manner as in the above-described electronic devices.

Furthermore, also in a power module made of silicon carbide (SiC), there has been proposed measures, such as, e.g., mounting a cooling plate or a heat sink, as countermeasures against heat generation.

In the meantime, in electronic devices, such as, e.g., a smartphone and a personal computer, the housing is thin, and therefore, the space for installing components is limited. For this reason, a heat exchanger, such as, e.g., a water-cooled cooling device and a heat pipe, is also required to be thin and compact.

However, since a conventional heat exchanger is produced by processing metal materials, there is a problem that there is a limitation in attempting thinning, resulting in a large size.

Therefore, the present applicant has proposed a heat exchanger capable of reducing the thickness by using a metal laminate material for an outer packaging member and an inner core member (see Patent Document 1 below).

PRIOR ART DOCUMENT

Patent Document

Patent Document 1: Japanese Unexamined Patent Application Publication No. 2020-3132

SUMMARY OF THE INVENTION

Problems to be Solved by the Invention

However, in the heat exchanger using the above-described metal laminate material, dissimilar materials of a metal foil and a resin layer are bonded. Therefore, depending on the selection of the bonding method, it has been found to affect the corrosion resistance and the durability against the heat transfer medium of the heat exchanger in the thermal environment.

Some preferred embodiments of the present invention have been made in view of the above-described and/or other problems in the related art. Preferred embodiments of the present invention can significantly improve upon existing methods and/or devices.

The present invention has been made in view of the above-described technical background. An object of the present invention is to provide a heat exchanger that hardly causes delamination, film peeling, and metal layer corrosion even when exposed to a high-temperature condition and is excellent in heat resistance, corrosion resistance, and durability.

Other objects and advantages of the present invention will be apparent from the following preferred embodiments.

Means for Solving the Problem

In order to achieve the above-described object, the present invention provides the following means.

[1] A heat exchanger comprising:
an outer packaging member provided with a heat transfer medium inlet and a heat transfer medium outlet, the outer packaging member being configured to allow a heat transfer medium flowed to an inside of the outer packaging member from the heat transfer medium inlet to pass through the inside and flow out from the heat transfer medium outlet,
wherein the outer packaging member is made of outer packaging laminate materials each including a metal heat transfer layer and a resin thermal fusion layer provided on one surface of the heat transfer layer, the outer packaging laminate materials being superimposed one on the other, the thermal fusion layers being integrally joined along peripheral edge portions of the outer packaging laminate materials, and
wherein the heat transfer layer and the thermal fusion layer of the outer packaging laminate material are laminated via an inner adhesive agent layer configured by an acid-modified polyolefin-based adhesive agent containing an acid-modified polyolefin-based resin.

[2] The heat exchanger as recited in the above-described Item [1],
wherein the acid-modified polyolefin-based adhesive agent comprises a polyolefin resin having a carboxyl group as a main agent and a polyfunctional isocyanate compound as a curing agent.

[3] The heat exchanger as recited in the above-described Item [2],
wherein a ratio of the number of isocyanato groups contained in the polyfunctional isocyanate compound to the number of carboxyl groups contained in the polyolefin resin is 1 to 20.

[4] The heat exchanger as recited in the above-described Item [2] or [3],
wherein the polyfunctional isocyanate compound comprises aliphatic isocyanate and aromatic isocyanate.

[5] The heat exchanger as recited in any one of the above-described Items [1] to [4],
wherein the inner adhesive agent layer comprises one or more metal salts composed of at least one kind of metal of Groups 7, 12, and 14.

[6] The heat exchanger as recited in any one of the above-described Items [1] to [5],
wherein a protective layer is laminated on the other surface of the heat transfer layer of the outer packaging member.

[7] The heat exchanger as recited in any one of the above-described Items [1] to [6], further comprising:

an inner core member arranged inside the outer packaging member, wherein the inner core member is composed of an inner core laminate material including a metal heat transfer layer and a resin thermal fusion layer provided on both sides of the heat transfer layer, the inner core member having a concave-convex portion, wherein the thermal fusion layers of a concave bottom surface and a convex top surface of the inner core member and the thermal fusion layer of the outer packaging member are integrally bonded, and wherein the thermal fusion layer of the outer packaging member and the thermal fusion layer of the inner core member are composed of the same kind of resin.

Effects of the Invention

According to the invention as recited in the above-described Item [1], the inner adhesive agent layer is configured by an acid-modified polyolefin-based adhesive agent containing an acid-modified polyolefin-based resin. Therefore, a heat exchanger excellent in heat resistance, LLC (anti-freeze) resistance, water-resistant, and durability can be provided because the heat resistance is good and a strong adhesive strength can be maintained under a high-temperature environment.

According to the invention as recited in the above-described Item [2], the acid-modified polyolefin-based adhesive agent comprises a polyolefin resin having a carboxyl group as a main agent and a polyfunctional isocyanate compound as a curing agent. Therefore, it is possible to enhance the reactivity of the polyolefin resin having a carboxyl group by the polyfunctional isocyanate compound.

According to the invention as recited in the above-described Item [3], a ratio of the number of isocyanato groups contained in the polyfunctional isocyanate compound to the number of carboxyl groups contained in the polyolefin resin is 1 to 20. Therefore, it is possible to provide a heat exchanger excellent in bonding properties, heat resistance, LLC (anti-freeze), and water-resistant.

According to the invention as recited in the above-described Item [4], the polyfunctional isocyanate compound comprises aliphatic isocyanate and aromatic isocyanate. Therefore, excellent bonding properties can be imparted by the aliphatic isocyanate, and heat resistance, LLC (anti-freeze) resistance, and water-resistant can be enhanced by the aromatic isocyanate.

According to the invention as recited in the above-described. Item [5], the inner adhesive agent layer comprises one or more metal salts composed of at least one metal of Groups 7, 12, and 14. Therefore, the isocyanato group and the carboxyl group can be efficiently crosslinked.

According to the invention as recited in the above-described Item [6], a protective layer is laminated on the other surface of the heat transfer layer of the outer packaging member. Therefore, it is possible to suppress the corrosion of the other surface of the heat transfer layer.

According to the invention as recited in the above-described Item [7], the heat exchanger further includes:

an inner core member arranged inside the outer packaging member, wherein the inner core member is composed of an inner core laminate material including a metal heat transfer layer and a resin thermal fusion layer provided on both sides of the heat transfer layer, the inner core member having a concave-convex portion, wherein the thermal fusion layers of a concave bottom surface and a convex top surface of the inner core member and the thermal fusion layer of the outer packaging member are integrally joined, and wherein the thermal fusion layer of the outer packaging member and the thermal fusion layer of the inner core member are composed of the same kind of resin.

Therefore, since the outer packaging member and the inner core member are easily thermally fused at the contact point, it is possible to provide a heat exchanger that is strong to the internal pressure.

BRIEF DESCRIPTION OF THE DRAWINGS

FIGS. 2(a), 2(b), and 2(c) are diagrams showing a heat exchanger according to the embodiment. FIG. 2(a) is a plan view, FIG. 2(b) is a cross-sectional view taken along the line A-A in FIG. 2(a), and FIG. 2(c) is a cross-sectional view taken along the line B-B in FIG. 2(a).

EMBODIMENTS FOR CARRYING OUT THE INVENTION

In this embodiment, the left-and-right direction in FIG. 2(a) is denoted as a "transverse direction," the up-and-down direction is denoted as a "vertical direction," the left direction is denoted as a "forward direction," and the right direction is denoted as a "backward direction."

The heat exchanger according to the present invention is used for a heat exchange in electronic equipment and a battery and is particularly used for cooling an in-vehicle battery.

The heat exchanger according to the present invention is also excellent in corrosion resistance to an LLC (long-life coolant) described later.

In the heat exchanger according to the present invention, a cooling fluid, such as, e.g., cooling water and an anti-freeze, is used as a heat transfer medium, and in particular, an LLC is used.

Note that the LLC is an anti-freeze in which ethylene glycol is contained as a main component and a rust preventive additive for various metals (iron, aluminum, and copper-based) is mixed.

Figure 1:
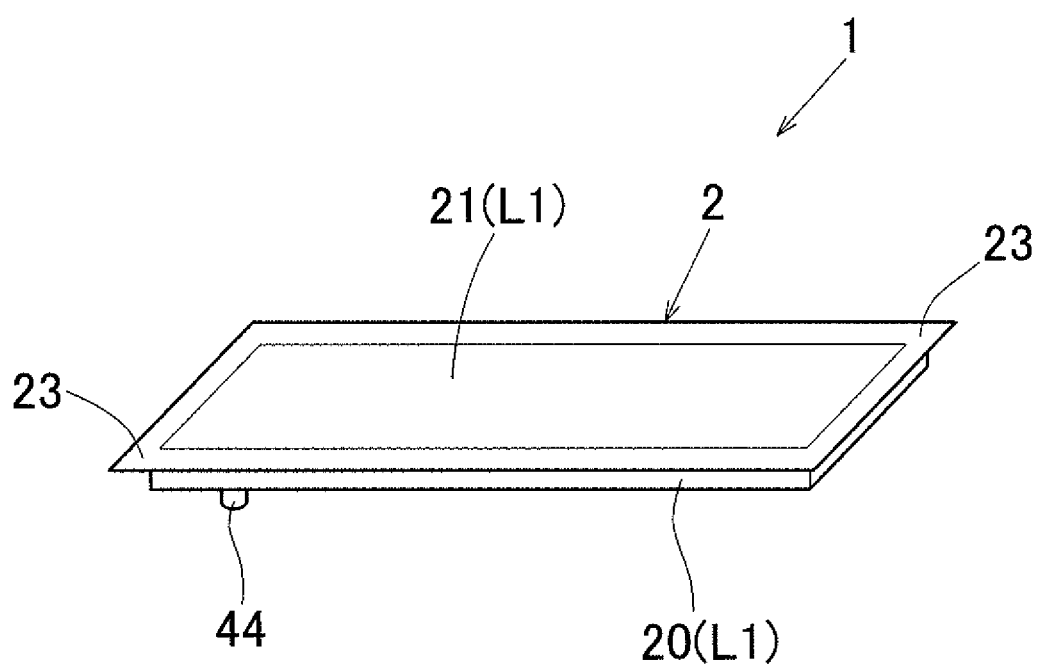
FIG. 1 is a perspective view showing a heat exchanger according to an embodiment of the present invention.
Figure 3:
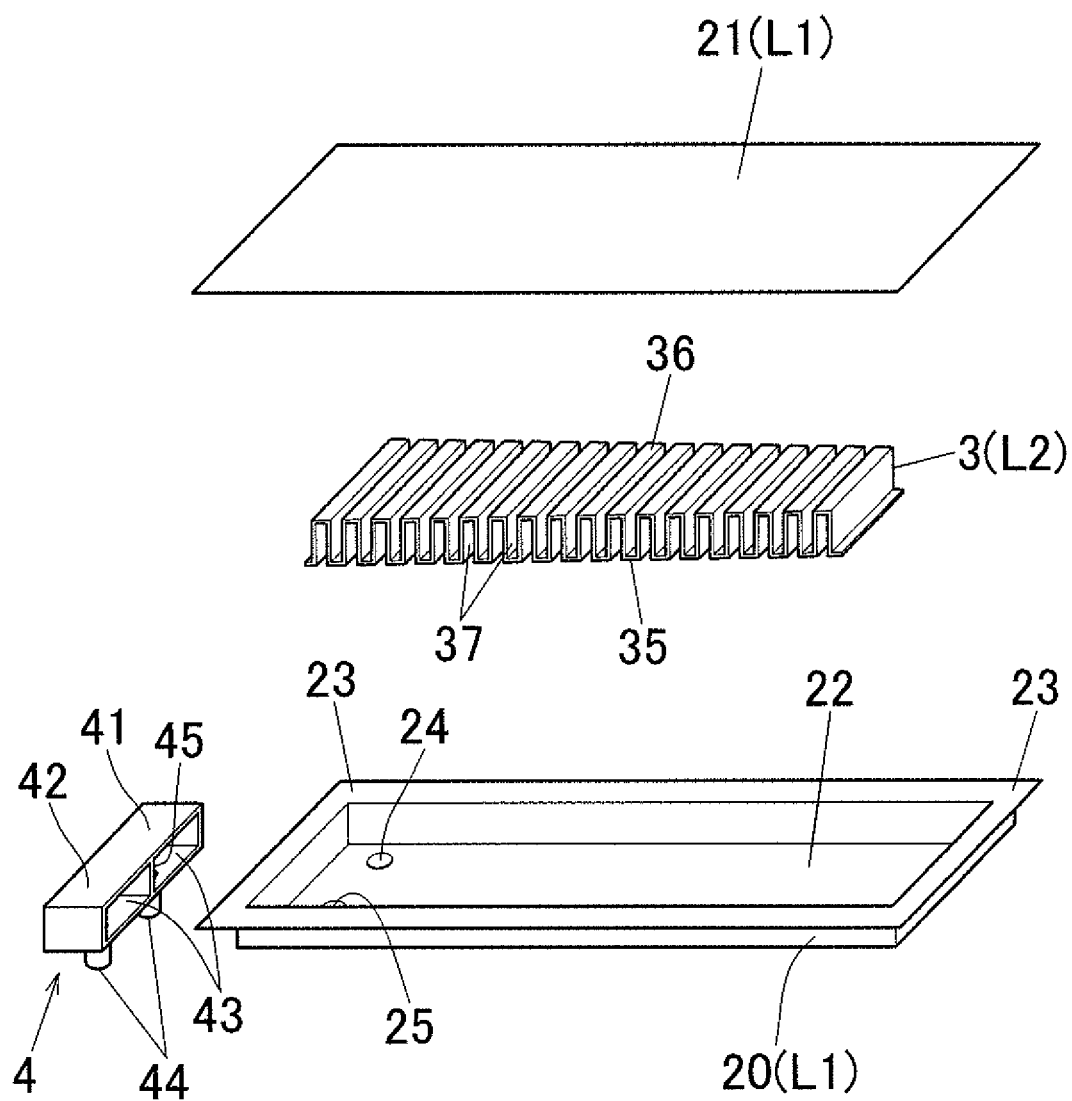
FIG. 3 is a perspective view showing a heat exchanger of this embodiment in an exploded manner.

As shown in FIGS. 1 to 3, the heat exchanger 1 of this embodiment includes an outer packaging member 2, an inner core member 3 arranged inside the outer packaging member 2, and a header 4 arranged at one end inside of the outer packaging member 2 in the transverse direction.

The outer packaging member according to the present invention has an outer shape of a heat exchanger and is provided with a heat transfer medium inlet and a heat transfer medium outlet. The outer packaging member is configured to allow the heat transfer medium flowed from the heat transfer medium inlet to pass through the inside and flow out from the heat transfer medium outlet. The outer packaging member is formed by superimposing outer packaging laminate materials, which will be described later, and integrally joining the thermal fusion layers along the peripheral edge portion thereof.

As shown in FIG. 3, the outer packaging member 2 of this embodiment is composed of a tray member 20 of a rectangular shape in a plan view and a cover member 21 of a rectangular shape in a plan view.

The tray member 20 includes a recessed portion 22 of a rectangular shape in a plan view and a flange portion 23 integrally protruding outward from the opening edge periphery of the recessed portion 22. The recessed portion 22 is formed by the entire area of the intermediate region except the outer peripheral edge portion recessed downward by using a cold forming, such as, e.g., deep drawing and protrusion forming.

As shown in FIG. 2(b), the side wall of the tray member 20 on the short side is formed to open outward at an angle θ2 with respect to the vertical direction. Further, as shown in FIG. 2(c), the side wall of the tray member 20 on the long side is formed to open outward at an angle θ2 with respect to the transverse direction.

Further, a heat transfer medium inlet 24 and a heat transfer medium outlet 25 are provided at one end side of the tray member 20 in the transverse direction.

The cover member 21 is configured such that its outer peripheral edge portion corresponds to the flange portion 23 of the tray member 20.

The tray member 20 and the cover member 21 are each configured by an outer packaging laminate material L1, which is a laminate sheet. The cover member 21 is superimposed on the tray member 20 from above, and the thermal fusion layers 53, which will be described later, at the outer peripheral edge portions of both the members 20 and 21 are integrally joined by thermal fusing (heat sealing). As a result, the outer packaging member 2 is formed.

The outer packaging laminate material according to the present invention includes a metal heat transfer layer and a synthetic resin thermal fusion layer provided on one side of the heat transfer layer. The heat transfer layer and the thermal fusion layer are laminated via an inner adhesive agent layer composed of an acid-modified polyolefin-based adhesive agent containing an acid-modified polyolefin-based resin.

Figure 5:
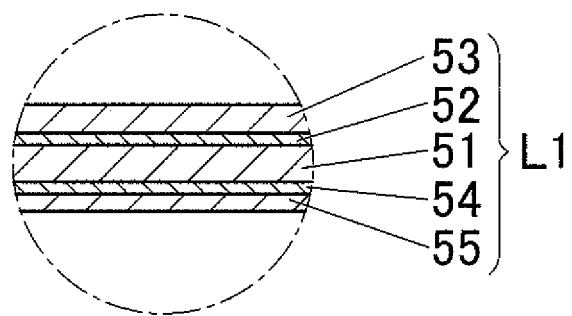
FIG. 5 is an enlarged cross-section showing the portion surrounded by the dashed line in FIG. 4.

As shown in FIG. 5, the outer packaging laminate material L1 of this embodiment has a configuration in which a thermal fusion layer 53 formed of a heat fusible resin sheet or a heat fusible resin film is laminated on the inner surface of a heat transfer layer 51 made of metal (metal foil) via an inner adhesive agent layer 52, and a protective layer 55 formed of a heat resistance resin film or a heat resistance resin sheet is laminated on the outer surface of the heat transfer layer 51 via an outer adhesive agent layer 54. Note that the term "foil" is used in the meaning including a film, a thin plate, a sheet, and the like.

As the heat transfer layer 51 of this embodiment, a copper foil, an aluminum foil, a stainless-steel foil, a nickel foil, a nickel-plated copper foil, a clad metal composed of a nickel foil and a copper foil, etc., can be suitably used. The thickness of the heat transfer layer 51 is preferably 20 μm to 200 μm. Note that the terms "copper," "aluminum," and "nickel" are used in the meaning including their alloys.

Further, more preferably, an aluminum foil of 40 μm to 150 μm is used for the heat transfer layer 51.

Further, in the heat transfer layer 51 of this embodiment, it is preferable to use a heat transfer layer having a Vickers hardness of 40 HV to 200 HV in accordance with JIS Z 2244. In a case where the Vickers hardness exceeds 200 HV and therefore is too hard, the handling property and molding process property deteriorate, lowering the processability, which is not preferable. On the contrary, in a case where the Vickers hardness is less than 40 HV, buckling deformation or the like may occur on the surface of the outer packaging member 2, depending on the use mode.

In the heat transfer layer 51 of this embodiment, it is required to use a heat transfer layer having an elongation of 0.1% to 20% in accordance with JIS K 7127. In a case where the elongation is less than 0.1%, it is not preferable because it becomes too hard, thereby deteriorating the handling property and the molding process property, which results in deteriorated processability, which is not preferable. On the other hand, in a case where the elongation exceeds 20%, the hardness becomes insufficient. Therefore, there is a possibility that it becomes difficult to assuredly prevent the formation of harmful uneven deformed portions due to stresses on the surface of the outer packaging member 2, which is not preferable.

Further, in the heat transfer layer 51, the durability, such as, e.g., corrosion prevention of the heat transfer layer 51, and the improvement of the adhesive properties can be further improved by subjecting the heat transfer layer to a surface treatment, such as, e.g., a chemical conversion treatment.

The chemical conversion treatment performs, for example, the following processing. That is, a surface of a metal foil to which a degreasing treatment has been subjected is coated with an aqueous solution of any one of the solutions 1) to 3) described below and then subjected to drying to perform a chemical conversion treatment.

1) An aqueous solution of a mixture containing phosphoric acid, chromic acid, and at least one kind of compound selected from the group consisting of a metal salt of fluoride and a non-metal salt of fluoride.
2) An aqueous solution of a mixture containing phosphoric acid, at least one kind of resin selected from the group consisting of an acryl-based resin, a chitosan derivative resin, and a phenol-based resin, and at least one kind of compound selected from the group consisting of chromic acid and chromium (III) salt.
3) An aqueous solution of a mixture containing phosphoric acid, at least one kind of resin selected from the group consisting of an acryl-based resin, a chitosan derivative resin, and a phenol-based resin, at least one kind of compound selected from the group consisting of chromic acid and chromium (III) salt, and at least one kind of compound selected from the group consisting of a metal salt of fluoride and a non-metal salt of fluoride.

It is preferable that the chemical conversion coating film is set to 0.1 mg/m$^2$ to 50 mg/m$^2$, more preferably 2 mg/m$^2$ to 20 mg/m$^2$, as a chromium adhesion amount (per one side).

As shown in FIG. 5, an inner adhesive agent layer 52 is laminated on the inner surface of the heat transfer layer 51 of this embodiment.

The inner adhesive agent layer according to the present invention is made of an acid-modified polyolefin-based adhesive agent containing an acid-modified polyolefin-based resin, and is laminated between the heat transfer layer and the thermal fusion layer of the outer packaging laminate material.

The acid-modified polyolefin-based adhesive agent of the present invention has heat resistance and contains a polyolefin resin having a carboxyl group.

The acid-modified polyolefin-based adhesive agent of this embodiment contains a polyolefin resin having a carboxyl group as a main agent and a polyfunctional isocyanate compound as a curing agent.

In this embodiment, the polyolefin resin having a carboxyl group is not particularly limited as long as it contains a carboxyl group in the molecular structure. Note that the term "carboxyl group" as used herein refers to a constitutional unit derived from carboxylic acid and also includes a constitutional unit derived from carboxylic acid anhydride. Examples of such a resin include those obtained by graft-polymerizing a monomer having a carboxyl group to polyolefin, those obtained by copolymerizing a monomer having a carboxyl group with an olefin, and those obtained by copolymerizing them in combination.

Examples of the monomer having a carboxyl group include ethylenically unsaturated carboxylic anhydride, such as, e.g., acrylic acid and methacrylic acid, ethylenically unsaturated carboxylic anhydride ester, such as, e.g., maleic anhydride, citraconic anhydride, and itaconic anhydride, and carboxyl group containing an ethylenic unsaturated carboxylic anhydride ester, such as, e.g., (metha)acrylic acid β-carboxyethyl. Among them, maleic anhydride is more preferred.

Further, an ethylenically unsaturated carboxylic acid ester having no carboxyl group may be contained as a monomer unit. The ethylenically unsaturated carboxylic acid ester not having a carboxyl group include, for example, an ester compound of acrylic acid or methacrylic acid and alcohol not having a carboxyl group of the carbon number 1 to 20, and can be exemplified by methyl (meth)acrylate, ethyl (meth)acrylate, (meth)propyl acrylate, (meth)butyl acrylate, (meth)hexyl acrylate, (meth)octyl acrylate, (meth)decyl acrylate, (meth)dodecyl acrylate, (meth)lauryl acrylate, stearyl (meth)acrylate, and the like. Further, a mixture thereof may be used.

Note that in this specification, "a polyolefin resin having a carboxyl group contains as a monomer unit" is intended to refer to "including as a raw material monomer when polymerizing a polyolefin resin having a carboxyl group."

As a polyolefin resin, those containing, as a monomer unit, monoorefin, such as, e.g., ethylene, propylene, butene, pentene, hexene, heptene, octene, and 4-methyl-1-pentene, may be exemplified. Further, those containing, as a monomer unit, alicyclic olefin, such as, e.g., cyclopentene and cyclohexene, chain or cyclic polyolefin, such as, e.g., 1,4-hexadiene, 1,5-hexadiene, divinylbenzene, 1,3-cyclopentadiene, 1,3-cyclohexadiene, and 5-vinyl-2-norbornene, and an aromatic vinyl compound, such as, e.g, styrene and substituted styrene, may be exemplified. Among them, a polyolefin-based resin is preferred from the viewpoint of adhesive properties to a polyolefin-base material. In particular, a polypropylene-based resin containing, as a monomer unit, propylene or, ethylene and propylene considering the heat resistant and the corrosion resistance.

It is preferable that the polyolefin resin having a carboxyl group contain a polyolefin resin having a carboxyl group in which the MFR (melt mass-flow rate) is 5 g/10 min to 42 g/10 min. When the MFR is 5 g/10 min or more, a decrease due to water or an LLC (anti-freeze) hardly occurs in the adhesive strength of the inner adhesive agent layer composed of an acid-modified polyolefin-based adhesive agent containing an acid-modified polyolefin-based resin. When the MFR is 42 g/10 min or less, the operability at the time of applying the acid-modified polyolefin-based adhesive agent becomes good.

The MFR in this specification is a value obtained by the method in accordance with JIS K7210, for example, under the condition of a load of 2160 g at a temperature of 230° C. in the case of a polypropylene-based resin and at a temperature of 190° C. in the case of a polyethylene-based resin. The MFR measured at 230° C. in the polyolefin resin having a carboxyl group is more preferably 8 g/10 min to 40 g/10 min, and still more preferably 12 g/10 min to 40 g/10 min.

The acid value of the polyolefin resin having a carboxyl group is preferably 3 to 60 mgKOH/g, more preferably 4 to 30 mgKOH/g. When the acid value is 3 mgKOH/g or more, a decrease due to water or an LLC (anti-freeze) hardly occurs in the adhesive strength of the inner adhesive agent layer composed of an acid-modified polyolefin-based adhesive agent containing an acid-modified polyolefin-based resin. When it is 60 mgKOH/g or less, the operability at the time of applying the acid-modified polyolefin-based adhesive agent becomes good. Note that the acid value in this specification is a value measured in accordance with JIS K0070 (1992).

The polyfunctional isocyanate compound of the present invention is a compound blended as a curing agent in an acid-modified polyolefin-based adhesive agent, and there is no particular limitation as long as it is polyisocyanate or the multimer thereof containing two or more isocyanato groups.

As the polyfunctional isocyanate compound of the present invention, a multimer of saturated aliphatic polyisocyanate, a multimer of saturated alicyclic polyisocyanate, and a multimer of aromatic polyisocyanate can be used. Note that the aromatic polyisocyanate refers to polyisocyanate having an aromatic ring in any of the structural formulas.

Examples of the multimer of saturated aliphatic polyisocyanate include multimers of saturated aliphatic diisocyanates, such as, e.g., hexamethylene diisocyanate, 2,4,4-trimethylhexamethylene diisocyanate, and 2,2,4-trimethylhexamethylene diisocyanate. These may be used alone or in combination of one or two or more thereof.

Further, examples of the form of the multimer include allophanated multimers, isocyanurate form and biuret denature products. Of these, allophanated multimer and isocyanurate form are preferred, and isocyanurate form is more preferred.

Examples of the multimer of the saturated alicyclic polyisocyanate include a multimer of a saturated alicyclic diisocyanate, such as, e.g., 1,4-cyclohexanediisocyanate, isophorone diisocyanate, methylenebis (4-cyclohexylisocyanate), 1,3-bis (isocyanatomethyl) cyclohexane, 1,4-bis (isocyanatomethyl) cyclohexane, and norbornane diisocyanate. These may be used alone or in combination of one or two or more kinds thereof.

Further, examples of the form of the multimer include allophanated multimer, isocyanurate form, and a biuret denature product. Of these, allophanated multimer and isocyanurate form are preferred, and isocyanurate form is more preferred.

Examples of the multimer of the aromatic polyisocyanate include a multimer of aromatic diisocyanate, such as, e.g., tolylene diisocyanate (TDI), diphenylmethane-4,4'-diisocyanate (MDI), and xylylene diisocyanate (XDI). These may be used alone or in combination of one or two or more kinds thereof.

Further, examples of the form of the multimer include allophanated multimer, isocyanurate form, biuret denature product, and polymeric MDI. Of these, allophanated multimer, isocyanurate form, and polymeric MDI are preferred, and polymeric MDIs are more preferred. Note that the polymeric MDI is also suitably used as a polymeric MDI mixture containing monomeric MDI.

Further, the above-described multimer may be used alone or as a mixture of two or ore more kinds thereof. Among them, multimer of polyisocyanate, such as, e.g., allophanated multimer, isocyanurate form, and biuret denature product are more preferred. By making the polyisocyanate multimeric, the acid-modified polyolefin-based adhesive agent becomes excellent in LLC (anti-freeze) resistance. The reason for this is unknown, but it is presumed that structure of the isocyanurate form and the allophanated multimer are excellent in resistance to LLC (anti-freeze). Of the multimers of these polyisocyanates, the isocyanurate form of polyisocyanate is particularly preferred. This is because the isocyanurate form is excellent in resistance to LLC (anti-freeze).

The polyfunctional isocyanate compound of this embodiment includes aliphatic isocyanate and aromatic isocyanate. The aliphatic isocyanate includes saturated aliphatic isocyanate and saturated cycloaliphatic isocyanate.

In this embodiment, the polyfunctional isocyanate compound contains aliphatic isocyanate and aromatic isocyanate, and therefore, excellent bonding properties can be imparted by the aliphatic isocyanate, and heat resistance, LLC (anti-freeze) resistance, and water-resistant can be enhanced by the aromatic isocyanate.

In this embodiment, the ratio (hereinafter also referred to as NCO/COOH ratio) of the number of isocyanato groups contained in the polyfunctional isocyanate compound to the number of carboxyl groups contained in the polyolefin resin is 1 to 20.

The inner adhesive agent layer containing an acid-modified polyolefin-based adhesive agent is excellent in bonding properties when the NCO/COOH ratio is 10 or more, is excellent in heat resistance when the NCO/COOH ratio is 10 or more, and is further excellent in LLC (anti-freeze) and water-resistant when the NCO/COOH ratio is 20 or less; and is hardly eroded against a heat transfer medium, such as, e.g., cooling water and an anti-freeze (e.g., LLC). Further, the NCO/COOH ratio is preferably 10 or more and 20 or less. The NCO/COOH ratio is a value calculated in accordance with JIS K6806 (2003).

When the ratio of the number of isocyanato groups contained in the polyfunctional isocyanate compound to the number of carboxyl groups contained in the polyolefin resin is 1 to 20, it is possible to provide a heat exchanger excellent in bonding properties and excellent in heat resistance, LLC (anti-freeze), and water-resistant.

In this embodiment as described above, the acid-modified polyolefin-based adhesive agent contains a polyolefin resin having a carboxyl group as a main agent and the polyfunctional isocyanate compound as a curing agent. Therefore, it is possible to enhance the reactivity of the polyolefin resin having a carboxyl group by the polyfunctional isocyanate compound.

Further, the inner adhesive agent layer 52 of this embodiment contains one or more kinds of metal salts composed of at least one kind of metals of Groups 7, 12 and 14 in a periodic table.

The metal salt is formulated as a reaction accelerator for promoting the reaction of a polyolefin resin having a carboxyl group in the acid-modified polyolefin-based adhesive agent with the polyfunctional isocyanate compound.

Further, as the metal salt, a metal salt containing at least one kind of metallic elements of a manganese of Group 7, zinc of Group 12, and tin of Group 14 may be used alone or in combination.

As the metal salt of this embodiment, for example, zinc neodecanoate, zinc 2-ethylhexanoate, zinc distearate, zinc acetylacetonate, manganese 2-ethylhexanoate, dibutyltin dilaurate, dioctyltin dilaurate, dioctyltin diacetate, or the like can be used, and it is preferable to use metallic carboxylate.

As a reaction accelerator other than the above-described metal salt, dibutyltin dilaurate, dioctyltin dilaurate, and dioctyltin diacetate, which are organotin compounds, and 2,4,6-tris (dimethylaminomethyl) phenol, dimethylaniline, dimethyl-p-toluidine, N,N-di((3-hydroxylethyl)-p-toluidine, and the like, which are tertiary amines, may be used in combination.

Further, the ratio of the metal salt to 100 parts by mass of polyolefin resin having a carboxyl group is not particularly limited, but the content of the metal salt is preferably 0.0001 parts by mass to 5 parts by mass in terms of the mass of the metal with respect to 100 parts by mass of the polyolefin resin having a carboxyl group.

When the content of the metal salt is 0.0001 parts by mass or more, decrease in the adhesive strength of the inner adhesive agent layer of the present invention due to water or LLC (anti-freeze) becomes less likely to occur. When it is 5 parts by mass or less, the high normal adhesive strength increases.

Note that the metal salt may be added at the time of producing the polyolefin resin having the carboxyl group or may be added at the time of preparing the adhesive agent.

In this embodiment, when the inner adhesive agent layer 52 contains one or more kinds of metal salts consisting of at least one kind of metal of Groups 7, 12, and 14, it is possible to efficiently crosslink the isocyanato group and the carboxyl group.

In addition, the acid-modified polyolefin-based adhesive agent of this embodiment may contain a solvent.

This solvent is not particularly limited as long as it is capable of dissolving or dispersing a polyolefin resin having a carboxyl group, a polyfunctional isocyanate compound, and a metal salt consisting of at least one kind of metal of Group 7, 12, and 14. For example, the examples of the solvent include an aromatic organic solvent, such as, e.g., toluene and xylene, an alicyclic organic solvent, such as, e.g., cyclohexane, methylcyclohexane, and ethylcyclohexane, an aliphatic organic solvent, such as, e.g., n-hexane and n-heptane, an ester-based organic solvent, such as, e.g., ethyl acetate, propyl acetate, and butyl acetate, and a ketone-based organic solvent, such as, e.g., acetone, methyl ethyl ketone, and methyl butyl ketone. These may be used alone or as a mixture of two or more kinds thereof.

Among these, from the viewpoint of solubility of a polyolefin resin having a carboxyl group, ethyl acetate, propyl acetate, butyl acetate, toluene, methylcyclohexane, and methylethyl ketone are preferred. Ethyl acetate, toluene, and, methylcyclohexane are more preferred.

In this embodiment, the content of the solvent in the acid-modified polyolefin-based adhesive agent is preferably 30 to 95 mass %, more preferably 40 to 90 mass %, and still more preferably 50 to 80 mass %. When it is 30 mass % or more, the operability at the time of applying the acid-modified polyolefin-based adhesive agent becomes good, and when it is 95 mass % or less, the thickness controllability of the laminate obtained by applying and curing the acid-modified polyolefin-based adhesive agent becomes good.

Further, in this embodiment, an additive agent, such as, e.g., tackifier and plasticizer, may be contained in the acid-modified polyolefin-based adhesive agent, as needed.

The tackifier is not particularly limited, and examples thereof include a polyterpene-based resin and a rosin-based resin in a natural system, and examples thereof include an aliphatic (C5)-based resin, an aromatic (C9)-based resin, a copolymerized (C5/C9)-based resin, and an alicyclic resin obtained from a cracked oil fraction of naphtha in a petroleum system. Further, the examples thereof include a hydrogenated resin obtained by hydrogenating a double bond portion of these resins. One kind of tackifier may be used only, or two or more kinds thereof may be used in combination.

The plasticizer is not particularly limited, and examples thereof include a liquid rubber, such as, e.g., polyisoprene and polybutene, and process oil.

Further, as long as the effect of this embodiment is not inhibited, a thermoplastic resin and/or a thermoplastic elastomer other than a polyolefin resin having a carboxyl group may be contained. The thermoplastic resin and the thermoplastic elastomer which can be blended include, for example, an ethylen-vinyl acetate copolymer resin, an ethylen-ethylacrylate copolymer resin, an SEBS (styrene-ethylen-butylene-styrene), an SEPS (styrene-ethylen-propylene-styrene), and the like.

The sum content of the polyolefin resin having a carboxyl group, a polyfunctional isocyanate compound, a metal salt consisting of at least one kind of the metals of Groups 0.7, 12, and 14, and a solvent component in the acid-modified polyolefin-based adhesive agent of this embodiment is preferably 80 mass % or more, more preferably 90 mass % or more, still more preferably 95 mass % or more, and even still more preferably 98 mass % or more.

In this embodiment, a thermal fusion layer 53 is laminated on the inner surface of the inner adhesive agent layer 52.

The thermal fusion layer of the present invention constitutes the innermost layer of the outer packaging laminate material.

Figure 4:
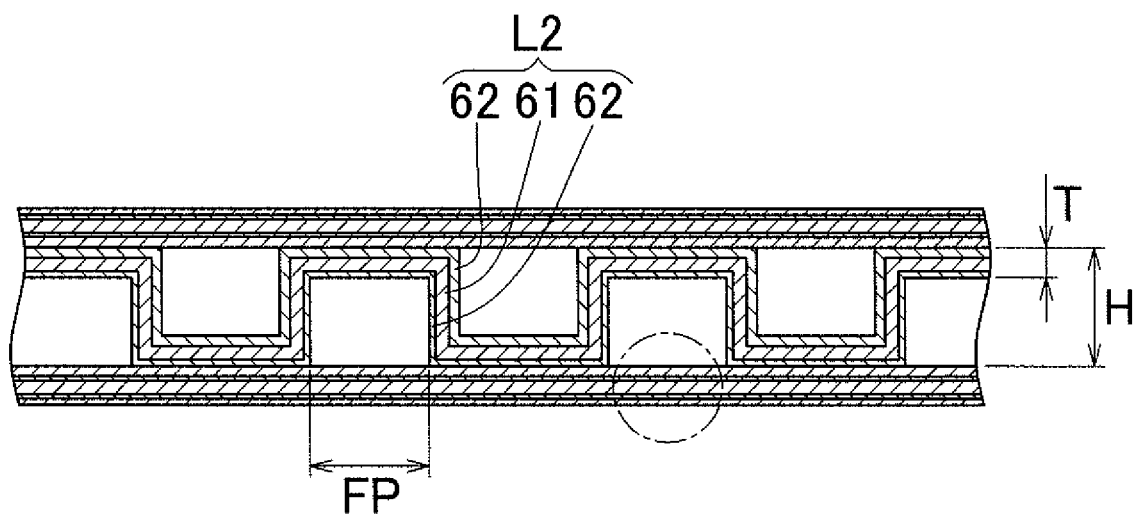
FIG. 4 is an enlarged cross-section of the portion surrounded by the dashed line in FIG. 2(b).

As shown in FIGS. 4 and 5, the thermal fusion layer 53 of this embodiment is laminated on the innermost side of the outer packaging laminate material L1.

As the thermal fusion layer 53, a film or a sheet made of a polyolefin-based resin, such as, e.g., polyethylene and polypropylene, or a modified resin thereof, a fluorine-based resin, a polyester-based resin, and a vinyl chloride resin, can be suitably used. The thickness of the thermal fusion layer 53 is preferably 10 μm to 80 μm.

As a thermal fusion layer 53, particularly, a film made of non-stretched polypropylene (CPP) having a thickness of 20 μm to 40 μm is preferably used.

In this embodiment, as described above, the heat transfer layer 51 and the thermal fusion layer 53 are laminated and bonded via the inner adhesive agent layer 52 made of the acid-modified polyolefin-based adhesive agent containing an acid-modified polyolefin-based resin. For this bonding, a known method, such as, e.g., a heat lamination method and a dry lamination method, can be used.

The heat lamination method is a method in which an adhesive agent containing no solvent is heated and melted at an adhesive surface of an object to be bonded or heated and extruded together with the object to be bonded, and thus, an adhesive agent layer is formed by interposing between the metal foil and the resin film.

The dry lamination method is a method in which an adhesive agent containing a solvent is applied to an adhesive surface of an object to be adhered and subjected to drying, and then overlapped with an adhesive surface of the other object to be adhered and crimped. Thus, the adhesive agent is interposed between the metal foil and the resin film to form an adhesive agent layer.

This embodiment employs a dry lamination method. This is because the dry lamination method is superior in heat resistance, but is not limited thereto. A heat lamination method may be employed without using a polyfunctional isocyanate compound, and an acid-modified polyolefin resin may be used as an adhesive agent.

Further, in this embodiment, as shown in FIGS. 4 and 5, a protective layer 55 is laminated on the outer surface of the heat transfer layer 51 via the outer adhesive agent layer 54.

The outer adhesive agent layer of the present invention is to bond the heat transfer layer to the protective layer which will be described later.

As the outer adhesive agent layer 54 of this embodiment, the above-described acid-modified polyolefin-based adhesive agent, urethane-based adhesive agent, acrylic adhesive agent, epoxy-based adhesive agent, and olefin-based adhesive agent can be used. In particular, it is preferable to use the above-described acid-modified polyolefin-based adhesive agent in view of heat resistance and corrosion resistance.

The protective layer of the present invention constitutes the outermost layer of the outer packaging laminate material.

As the protective layer 55 of this embodiment, a film or a sheet made of a polyester resin (PET, PBT, PEN, or the like), a polyamide resin (PA6, PA66, or the like), and a polyolefin-based resin (HDPE, LLDPE, OPP, CPP, or the like), which are heat resistant resins, can be suitably used.

Note that the meanings of the above-described abbreviations are as follows.

"PET" denotes polyethylene terephthalate, "PBT" denotes polybutylene terephthalate, "PEN" denotes polyethylene naphthalate, "PA6" denotes nylon 6, "PA66" denotes nylon 66, "HDPE" denotes high density polyethylene, "LLDPE" denotes linear low-density polyethylene, "OPP" denotes stretched polypropylene, and "CPP" denotes non-stretched polypropylene.

Here, as a heat resistant resin constituting the protective layer 55, a heat resistant resin which is not melted by the heating temperature at the time of the thermal fusion treatment of the outer packaging member 2, the inner core member 3, or the like is used. As this heat resistant resin, it is preferable to use a heat-resistant resin having a melting point higher than the melting point of the heat fusible resin by 10° C. or more. Further, it is particularly preferable to use a heat-resistant resin having a melting point higher than the melting point of the heat fusible resin by 20° C. or more.

Further, the thickness of the protective layer 55 is preferably 5 μm to 50 μm, more preferably 10 μm to 25 μm.

As described above, in this embodiment, the protective layer 55 is laminated on the outer surface of the heat transfer layer 51 via the outer adhesive agent layer 54, and therefore, it is possible to suppress the corrosion of the outer surface of the heat transfer layer 51.

In this embodiment, the outer packaging laminate material L1 constitutes the tray member 20 and the cover member 21 of the outer packaging member 2, and the inner core member 3 is arranged inside the outer packaging member 2.

The inner core member of the present invention is arranged inside the outer packaging member. The inner core member is formed by an inner core laminate material and has a concave-convex portion. The thermal fusion layer of the concave bottom surface and that of the convex top surface of the inner core member are integrally joined to the thermal fusion layer of the outer packaging member.

The inner core laminate material of the present invention includes a metal heat transfer layer and a synthetic resin thermal fusion layer provided on both sides of the heat transfer layer.

As shown in FIG. 4, the inner core laminate material L2 of this embodiment is composed of a heat transfer layer 61 and thermal fusion layers 62 and 62 formed of a resin film or a plastic sheet laminated on both sides of the heat transfer layer 61 via an adhesive agent.

As the heat transfer layer 61 of this embodiment, a copper foil, an aluminum foil, a stainless-steel foil, a nickel foil, a nickel-plated copper foil, a clad metal made of a nickel foil and a copper foil, or the like can be suitably used, and the thickness of the heat transfer layer 61 is preferably 20 µm to 200 µm.

Further, it is more preferable to use an aluminum foil of 20 µm to 150 µm for the heat transfer layer 61.

In the heat transfer layer 61 of this embodiment, it is preferable to use a heat transfer layer having a Vickers hardness of 40 HV to 200 HV in accordance with JIS Z 2244. When the Vickers hardness exceeds 200 HV and is too hard, the handling property and the forming workability deteriorate, and the processability is lowered, which is not preferable. On the other hand, when the Vickers hardness is less than 40 HV, buckling deformation or the like may occur in the inner core member 3 depending on the use mode.

Further, in the heat transfer layer 61 of this embodiment, it is required to use a heat transfer layer having the elongation of 5% to 40% in accordance with JIS K 7127. When the elongation is less than 5%, it becomes too hard, and therefore, the handling property and the forming workability deteriorate, and therefore, the processability is lowered, which is not preferable. On the other hand, when the elongation exceeds 40%, the hardness becomes inadequate, and it may be difficult to assuredly prevent harmful deformation of the inner core member 3 such as buckling deformation, which is not preferable.

Further, in the heat transfer layer 61, similarly to the heat transfer layer 51, the heat transfer layer is subjected to the above-described chemical conversion treatment.

As the thermal fusion layer 62 of this embodiment, a film or a sheet made of a polyolefin-based resin, such as, e.g., polyethylene and polypropylene, or a modified resin thereof, a fluorine-based resin, a polyester-based resin, a vinyl chloride resin or the like, can be suitably used. The thickness of the thermal fusion layer 62 may be 10 µm to 80 µm.

As the thermal fusion layer 62, particularly, a film made of non-stretched polypropylene (CPP) having a thickness of 20 µm to 40 µm is preferably used.

Further, in this embodiment, as the adhesive agent for bonding the heat transfer layer 61 and the thermal fusion layer 62, the above-described acid-modified polyolefin-based adhesive agent, urethane-based adhesive agent, acryl-based adhesive agent, epoxy-based adhesive agent, and olefin-based adhesive agent can be used. In particular, it is preferable to use the above-described acid-modified polyolefin-based adhesive agent in view of heat resistance and corrosion resistance.

In this embodiment, as shown in FIGS. 2(a)-(c) and 3, the inner core member 3 constituted by the inner core laminate material L2 is disposed inside the recessed portion 22 of the tray member 20 in an area excluding one end in the transverse direction in the recessed portion 22. Inflow/outflow passages 11 are formed in a gap between the inner core member 3 and the outer packaging member 2.

As shown in FIG. 2(a), the inner core member 3 is formed in a trapezoidal shape in a plan view in which it is inclined at an inclination angle θ1 from both vertices of the front-end side in the transverse direction such that the width gradually decreases from the front end toward the rear end. As shown in FIG. 2(b), the inner core member 3 is formed such that the transverse cross-section is a square wave shape in which a recess 35 and a protrusion 36 are alternately arranged, the bottom surface (bottom wall) of the recess 35 and the top surface (top wall) of the protrusion 36 are formed to be flat.

Further, as shown in FIG. 4, the inner core member 3 of this embodiment is formed to have a relation of FP {(H/2)+ T}, when the distance between the adjacent recesses 35 is FP, the height of the inner core member 3 is H, and the thickness of the inner core laminate material L2 is T.

Further, the thermal fusion layer 62 constituting the bottom surface of the recess 35 and the thermal fusion layer 53 constituting the top surface of the protrusion 36 and the thermal fusion layer 53 of the outer packaging member 2 are integrally joined by thermal fusion (heat sealing).

In this embodiment, the thermal fusion layer 62 of the inner core member 3 and the thermal fusion layer 53 of the outer packaging member 2 are made of the same kind of resin.

In this embodiment, the inner core member 3 arranged inside the outer packaging member 2 is provided. The inner core member 3 is formed of an inner core laminate material L2 including the metal heat transfer layer 61 and the resin thermal fusion layer 62 provided on both sides of the heat transfer layer 61, and has a concave-convex portion. The thermal fusion layer 62 of the bottom surface of the recess 35 and the thermal fusion layer 62 of the top surface of the protrusion 36 of the inner core member 3 and the thermal fusion layer 53 of the outer packaging member 2 are integrally joined together. The thermal fusion layer 62 of the inner core member 3 and the thermal fusion layer 53 of the outer packaging member 2 are made of the same kind of resin, and therefore, the outer packaging member 2 and the inner core member 3 are easily thermally fused at the contact point thereof. Thus, it is possible to provide a heat exchanger 1 strong to the internal pressure.

Further, the inner core member 3 of this embodiment is formed such that the direction of the ridge and the direction of the valley are parallel to the vertical direction. A plurality of intermediate flow passages 37 as tunnels and grooves is formed by the ridges and the valleys of the inner core member 3. These intermediate flow passages 37 are configured such that the heat transfer medium flowing into the inflow/outflow passage 11 can be smoothly distributed from one end side to the other end side of the outer packaging member 2 in the vertical direction.

Note that the orientation of the inner core member 3, the planar shape and the unevenness shape of the inner core member 3 itself are not limited to this embodiment shape. For example, the cross-section in the vertical direction may be convex.

In this embodiment, as shown in FIGS. 2(a)-(c) and 3, a header 4 is provided inside the outer packaging member 2.

The header 4 of this embodiment is provided with an inlet header 41 and an outlet header 42. The inlet header 41 and the outlet header 42 are partitioned by a partition wall 45. Further, the inlet header 41 and the outlet header 42 each have an opening portion 43 on one side thereof.

The inlet header 41 and the outlet header 42 are provided with a pair of pipe portions 44. Each of the pipe portions 44 communicates with the inside of the header 4 and is configured to allow the heat transfer medium to pass between the inside of the pipe portion 44 and the inside of the header 4.

These pipe portions 44 are intended to be inserted into the heat transfer medium inlet 24 and the heat transfer medium outlet 25 formed in the outer packaging member 2.

The header 4 of this embodiment is arranged in the outer packaging member 2 such that the opening portions 43 face the inner core member 3 in the vicinity of the heat transfer medium inlet 24 and the heat transfer medium outlet 25. The inlet header 41 is arranged to correspond to one of the inflow/outflow passages (inflow passage) 11 via the opening portion 43, and the outlet header 42 is arranged to correspond to the other of the inflow/outflow passages (outflow passage) 11 via the opening portion 43.

As described above, since the header 4 is provided in the vicinity of the heat transfer medium inlet 24 and the heat transfer medium outlet 25 in the outer packaging member 2, it is possible to equalize the flow velocity distribution in the flow path inside the heat exchanger 1.

As the header 4, it is preferable to use a resin of the same kind as the resin constituting the thermal fusion layer 53 of the outer packaging member 2 and the thermal fusion layer 62 of the inner core member 3. Specifically, a polyolefin-based resin, such as, e.g., polyethylene and polypropylene or the modified resin thereof, a fluorine-based resin, a polyester-based resin, a vinyl chloride resins, and the like can be suitably used.

In this embodiment, the header 4 is formed of a resin-molded product that can be thermally welded to the thermal fusion layer 53 of the outer packaging laminate material L1. The thermal fusion layer 53 of the outer packaging laminate material L1 and the header 4 are formed of the same kind of resin.

As described above, since the header 4 is formed of a resin molded product that can be heat sealed to the thermal fusion layer 53 of the outer packaging laminate material L1, and the thermal fusion layer 53 of the outer packaging laminate material L1 and the header 4 are made of the same kind of resin. Therefore, since it is easy to heat seal the outer packaging member 2 and the header 4 at the contact point, the header 4 can be fixed to the heat exchanger 1.

The arrangement of the header 4 is not limited to this embodiment. For example, the inlet header 41 and the outlet header 42 may be arranged on opposite sides.

In the heat exchanger 1 having the above-described configuration, a cooling fluid is caused to flow into the inlet header 41 from one of the pipe portions 44, and the cooling fluid is caused to flow into one of the inflow/outflow passages (inflow passage) 11. Further, the cooling fluid is caused to pass through a plurality of intermediate flow passages 37 to be flowed out from the other inflow/outflow passage (outflow passage) 11. Further, the cooling fluid is caused to flow into the outlet header 42 through the opening portion 43 to be flowed out from the other pipe portion 44. Thus, by circulating the cooling fluid inside the outer packaging member 2, a heat exchange target member is cooled by exchanging heat between the heat exchange target member, such as, e.g., a battery disposed outside the outer packaging member 2, and the cooling fluid via the outer packaging member 2 and the inner core member 3.

As described above, in this embodiment, the heat exchanger is provided with a molded container-like outer packaging member 2 provided with the heat transfer medium inlet 24 and the heat transfer medium outlet 25, the outer packaging member being configured to allow a heat transfer medium flowed to an inside of the outer packaging member from the heat transfer medium inlet 24 to pass through the inside and flow out from the heat transfer medium outlet 25. The outer packaging member 2 is made of the outer packaging laminate materials L1 each including the metal heat transfer layer 51 and the resin thermal fusion layer 53 provided on one surface of the heat transfer layer 51. The outer packaging laminate materials L1 are superimposed one on the other, and the thermal fusion layers 53 are integrally bonded along peripheral edge portions thereof to form a container shape. The heat transfer layer 51 and the thermal fusion layer 53 of the outer packaging laminate materials are laminated via the inner adhesive agent layer 52 made of an acid-modified polyolefin-based adhesive agent containing an acid-modified polyolefin-based resin. Therefore, since heat resistance is good, and strong adhesive strength can be maintained under a high-temperature environment. Thus, it is possible to provide a heat exchanger 1 excellent in heat resistance, LLC (anti-freeze) resistance, water-resistant, and durability.

In the above-described embodiment, the outer packaging member 2 is formed in a container shape by superimposing the outer packaging laminate materials L1 and integrally bonding the thermal fusion layers 53 along the peripheral edge portion by thermal fusion (heat sealing). The inner core member 3 is formed of the inner core laminate material L2 and has concave-convex portions. The thermal fusion layer 62 of the bottom surface of the recess 35 and the top surface of the protrusion 36 of the inner core member 3 and the thermal fusion layer 53 of the outer packaging member 2 are integrally bonded. However, the present invention is not limited thereto. For example, the thermal fusion layers 53 of the overlapped outer packaging laminate materials L1 are heat sealed along the peripheral edge portion of the overlapped outer packaging laminate materials L1 to form a container shape, and the heat sealed peripheral edge portions are subjected to physical bonding by double winding to form a double winding structure. With such a double winding structure, it is possible not only to maintain the sealing performance against the internal pressure but also to improve the pressure resistance and compact the heat exchanger as well.

EXAMPLES

Next, some specific examples of the present invention will be described, but it should be noted that the present invention is not particularly limited to these examples.

Example 1

Outer packaging laminate material: PET12/Outer adhesive agent layer/AL120/Inner adhesive agent/CPP30

Inner core laminate material: CPP30/Adhesive agent/AL120/Adhesive agent/CPP30

As the outer packaging laminate material L 1, two pieces provided with a heat transfer layer 51, a thermal fusion layer 53, and a protective layer 55 were prepared. The heat transfer layer 51 was made of an AL (aluminum) foil having a thickness of 120 μm. The thermal fusion layer 53 was formed of a CPP (non-stretched polypropylene) film having a thickness of 30 μm formed on the inner surface side of the heat transfer layer 51 via an inner adhesive agent layer 52 described later. The protective layer 55 was made of a PET (polyethylene terephthalate) film having a thickness of 12 μm formed on the outer surface side of the heat transfer layer 51 via an outer adhesive agent layer 54 made of a maleic acid-modified polypropylene-based adhesive agent composed of polypropylene having a carboxyl group caused by maleic acid as a main agent.

Here, the following maleic acid-modified polypropylene-based adhesive agent was used as the inner adhesive agent layer 52.

In the maleic acid-modified polypropylene-based adhesive agent, as a polypropylene resin which is a main agent, 15 parts by mass of polypropylene having an MFR of 40 g/10 min at 230° C. and an acid value of 5.7 mgKOH/g was used, as a polyfunctional isocyanate compound, a mixture of 3 parts by mass of hexamethylene diisocyanate (HDI), which is a multimer of saturated aliphatic diisocyanate, 2.3 parts by mass of isophorone diisocyanate (IPDI), which is a multimer of saturated alicyclic diisocyanate, was used, and 0.2 parts by mass of diphenylmethane-4,4'-diisocyanate (MDI), which is a multimer of aromatic diisocyanate, was used. As a metallic carboxylate, 0.02 parts by mass of tin-based carboxylate (dibutyltin diuranate) was used, and as a solvent, 85 parts of a mixture of toluene and ethyl acetate mixed at 9:1, the ratio of the number of isocyanato group to the number of carboxyl groups was 14, was used (see Table 1). Note that the maleic acid-modified polypropylene-based adhesive agent of the outer adhesive agent layer 54 was also the same as that of the inner adhesive agent layer 52.

As the inner core laminate material L2, an inner core laminate material provided with a heat transfer layer 61 made of an AL (aluminum) foil having a thickness of 120 μm and a thermal fusion layer 62 made of a CPP (non-stretched polypropylene) film having a thickness of 30 μm formed on both sides of the heat transfer layer 61 via a maleic acid-modified polypropylene-based adhesive agent was prepared.

Note that the maleic acid-modified polypropylene-based adhesive agent of the inner core laminate material L2 was also the same as that of the inner adhesive agent layer 52.

Using the above-described outer packaging laminate material L1, a tray member 20 and a cover member 21 corresponding to the embodiment shown in FIGS. 1, 2(a)-(c), and 3 were produced. That is, a tray member 20 having a recessed portion 22 and a flange portion 23 formed along the entire periphery of the recessed portion 22 was formed by performing deep drawing to one of the outer packaging laminate materials L1. The recessed portion 22 had a vertical length of 80 mm, a lateral length of 160 mm, a depth of 4 mm, and a corner angle of 10 degrees (FIGS. 2(b) and 2(c)).

Furthermore, two holes each having a diameter φ13 mm were formed in the front end portion (end portion in the transverse direction) of the tray member 20 so as to be arranged in the vertical direction to form a heat transfer medium inlet 24 and a heat transfer medium outlet 25.

The other outer packaging laminate material L1 was cut into a length of 80 mm and a width of 160 mm to prepare a cover member 21.

Further, the inner core member 3 of this embodiment shown in FIGS. 3 and 4 was produced by using the above-described inner core laminate material L2. That is, embossing roll processing was performed on an inner core laminate material L2 to produce a square wave rectangular inner core member 3 in which the distance FP between adjacent recesses 35 was 4 mm, the height H of the inner core member 3 was 4 mm, and the thickness T of the inner core laminate material L2 was 0.186 mm.

Further, the inner core member 3 was cut by 76 mm in the flow direction (the direction of the ridge and the direction of the valley) and 120 mm in the transverse direction. Further as shown in FIG. 2(a), trimming processing was performed so as to be inclined at the inclination angle θ1 of 3 degrees from both vertices of the front-end side to thereby produce a trapezoidal inner core member 3 in which the width gradually decreased from one end (front end) to the other end (rear end).

Further, as shown in FIG. 3, injection molding was performed using a material made of propylene-ethylene random copolymer (MFR in accordance with JIS K7210 at 230° C. was 15 g/10 minutes) to prepare a header 4. The header 4 had a length of 80 mm, a width of 20 mm, and a thickness of 2 mm. The pipe portion 44 had an inner diameter φ of 8 mm, and the outer diameter φ of 11 mm, and a height of 5 mm. Note that a partition wall 45 partitioning the inlet header 41 and the outlet header 42 was provided in the header 4.

Subsequently, the header 4 was accommodated at the front end portion in the recessed portion 22 of the tray member 20. At this time, the pair of pipe portions 44 were accommodated in the tray member 20 so as to be fitted in the heat transfer medium inlet 24 and the heat transfer medium outlet 25 formed in the tray member 20. Further, the inner core member 3 was arranged on the rear side of the header 4 in the recessed portion 22 so as to be adjacent to the header 4. The inner core member 3 was arranged such that the intermediate flow passage 37 (the ridge direction and the valley direction) was arranged to be parallel to the longitudinal direction of the header 4. At this time, the gaps between both long sides of the inner core member 3 and the outer packaging member 2 were made uniform.

Next, the cover member 21 was placed to close the recessed portion 22 of the tray member 20 from above.

As described above, a heat exchanger temporary assembly in a non-bonded state was produced. The temporary assembly was subjected to a heat fusing treatment under the thermal fusing conditions of a temperature of 200° C., a pressure of 0.3 MPa, and a time of 6 seconds using upper and lower sealing dies that fits the shape of the temporary assembly to thermally bond (heat seal) the components. Thereafter, the molded outer peripheral portion was trimmed such that the seal width (width of the flange portion) became 5 mm in the entire circumference to produce a heat exchanger 1 of Example 1.

Examples 2

A heat exchanger 1 was prepared in the same manner as in Example 1 except that a maleic acid-modified polypropylene-based adhesive agent using polypropylene having an MFR of 12 g/10 min and an acid value of 5.7 mgKOH/g at 230° C. was used as the inner adhesive agent layer 52.

Comparative Example 1

A heat exchanger 1 was prepared in the same manner as in Example 1 except that a maleic acid-modified polypropylene-based adhesive agent using polypropylene having an MFR of 40 g/10 min at 230° C. and an acid value of 56 mgKOH/g and a ratio of number of the isocyanato groups to the number of carboxyl groups of 0.6 were used as the inner adhesive agent layer 52.

Comparative Example 2

A heat exchanger 1 was prepared in the same manner as in Example 1 except that a maleic acid-modified polypropylene-based adhesive agent was used as the inner adhesive agent layer 52 in which polypropylene having an MFR of 40 g/10 min and an acid value was 3.4 mgKOH/g at 230° C. and a ratio of the number of isocyanato groups to the number of carboxyl groups was 29 were used.

Comparative Example 3

A heat exchanger 1 was prepared in the same manner as in Example 1 except that the following urethane-based adhesive agent (polyester polyol) was used as the inner adhesive agent layer 52.

An urethane-based adhesive agent is composed of a mixture of 3 parts by mass of hexamethylene diisocyanate (HDI), which is a multimer of saturated aliphatic diisocyanate as a curing agent, 2.3 parts by mass of isophorone diisocyanate (IPDI), which is a multimer of saturated alicyclic diisocyanate polyfunctional isocyanate, and 0.2 parts by mass of tolylene diisocyanate (TDI), which is a multimer of aromatic diisocyanate, as a polyfunctional isocyanate compound which is a curing agent, 0.02 parts by mass of tin-based carboxylate as a metallic carboxylate, and 85 parts by mass of a mixture of toluene and ethyl acetate mixed at the ratio of 9:1, the ratio of the number of isocyanato groups to the number of hydroxyl groups was 10 (see Table 1).

Various evaluations were performed on each heat exchanger 1 prepared as described above based on the following evaluation methods.

<Repeated Pressure Resistance Test>

Five heat exchanges of Example 1 and 2 and Comparative Examples 1 to 3 were prepared. Each heat exchanger was repeatedly loaded with tap water at normal temperature (23° C.) under a flow pressure of 0 MPa to 0.2 MPa to observe the appearance of each heat exchanger after 15,000 times to evaluate whether blistering and peeling occurred at any location. The results were evaluated based on the criteria below.

(Criteria)

[○] . . . No peeling occurred (Good)

[△] . . . Peeling between the outer packaging member 2 and the inner core member 3 occurred in one heat exchanger out of five heat exchangers (Passed)

[X] . . . Peeling between the outer packaging member 2 and the inner core member 3 occurred in two or more heat exchangers out of five heat exchangers (Failed).

<High-Temperature Pressure Resistance Test>

(Evaluation of the Presence or Absence of Delamination when Used in Environments Loaded with Internal Pressure at High Temperature)

Five heat exchangers of Examples 1, 2, and Comparative Examples 1 to 3 were prepared. Each heat exchanger was poured with 50 vol/vol % of an LLC aqueous solution and warmed to 90° C. The internal pressure was loaded with 0.13 MPa and maintained for up to 250 hours. The appearance of each heat exchanger was observed to evaluate whether swelling or peeling occurred at any site.

(Criteria)

[○] . . . No peeling occurred (Good)

[△] . . . Peeling between the outer packaging member 2 and the inner core member 3 occurred in one heat exchanger out of five heat exchangers (Passed)

[X] . . . Peeling between the outer packaging member 2 and the inner core member 3 occurred in two or more heat exchangers out of five heat exchangers (Failed).

<Lamination Strength Measurement Method at High Temperature>

A test piece having a width of 15 mm and a length of 150 mm was cut from the resulting outer packaging member 2, and separation was made between the aluminum foil (heat transfer layer 51) and the thermal fusion layer 53 in the region from one end of the test piece in the length direction to the position 10 mm inward therefrom.

In accordance with JIS K6854-3 (1999), using a Astrograph manufactured by Shimadzu Corporation (AGS-5kNX), a laminate containing an aluminum foil was clamped and fixed with one chuck, and the separated thermal fusion layer 53 was clamped and fixed with the other chuck and held for one minute in a temperature environment of 90° C. at a tensile speed of 100 mm/minute in a temperature environment of 90° C., and the separation strength when T-shape separation was performed was measured. The value at which the measurement value was stabilized are set as the "lamination strength (N/15 mm range)" at high temperature. The results of the measurements were evaluated based on the following criteria.

(Criteria)

[○] . . . Lamination strength was equal to or greater than "3.0 N/15 mm width"

[△] . . . Lamination strength was "1.5 N/15 mm width" or more and less than "3.0 N/15 mm width"

[X] . . . Lamination strength was less than "1.5 N/15 mm width"

<Comprehensive Evaluation>

As for the overall evaluation, those for which "○" evaluation was obtained in all of the above-described repeated pressure resistance test, high-temperature pressure resistance test, and lamination strength measurement method at high temperature were designated as "○", and those for which "○" evaluation was not obtained in any one were designated as "X". The results are shown in Table 1.

TABLE 1

| | Adhesive agent layer Adhesive agent layer type | Olefin-based adhesive agent | | | | | | | |
|---|---|---|---|---|---|---|---|---|---|
| | | Polyolefin resin (Polypropylene) 15 parts by mass | | Polyfunctional isocyanate compound [Curing agent] | | | | | Adhesive agent layer |
| | Inner adhesive agent layer | MFR (g/10 min) 230° C. | Acid value of olefin (mgKOH/g) | 3 pts. mass Aliphatic | 2.3 pts. mass, Alicilic | 0.2 pts. mass Aromatic | Metal Carboxylate 0.02 pts. Mass | Solvent 85 pts. Mass | [NCO/[X] ratio] NC/COOH |
| Ex. 1 | Maleic acid-modified polypropylene-based adhesive agent | 40 | 5.7 | HDI | IPDI | MDI | Tin carboxylic acid salt (Dibutyltin dilaurate) | Toluene:Ethyl acetate = 9:1 | NCO/COOH 14 |
| Ex. 2 | Maleic acid-modified polypropylene-based adhesive agent | 12 | 5.7 | HDI | IPDI | MDI | Tin carboxylic acid salt | Toluene:Ethyl acetate = 9:1 | NCO/COOH 14 |

TABLE 1-continued

| | | | | | | | | | |
|---|---|---|---|---|---|---|---|---|---|
| Comp. Ex. 1 | Maleic acid-modified polypropylene-based adhesive agent | 40 | 56 | HDI | IPDI | MDI | Tin carboxylic acid salt | Toluene:Ethyl acetate = 9:1 | NCO/COOH 0.6 |
| Comp. Ex. 2 | Maleic acid-modified polypropylene-based adhesive agent | 40 | 3.4 | HDI | IPDI | MDI | Tin carboxylic acid salt | Toluene:Ethyl acetate = 9:1 | NCO/COOH 29 |
| Comp. Ex. 3 | Urethane-based adhesive agent (Polyester polyol) | — | — | HDI | IPDI | TDI | Tin carboxylic acid salt | Toluene:Ethyl acetate = 9:1 | NCO/OH 10 |

| | Adhesive agent at the other portion | | Repeated pressure resistance test | High temperature pressure resistance test | High temperature lamination strength | Overall evaluation |
|---|---|---|---|---|---|---|
| | Outer adhesive agent | Inner core member | | | | |
| Ex. 1 | Maleic acid-modified polypropylene-based adhesive agent | Maleic acid-modified polypropylene-based adhesive agent | ○ | ○ | ○ | ○ |
| Ex. 2 | Maleic acid-modified polypropylene-based adhesive agent | Maleic acid-modified polypropylene-based adhesive agent | ○ | ○ | ○ | ○ |
| Comp. Ex. 1 | Maleic acid-modified polypropylene-based adhesive agent | Maleic acid-modified polypropylene-based adhesive agent | ○ | Δ | Δ | X |
| Comp. Ex. 2 | Maleic acid-modified polypropylene-based adhesive agent | Maleic acid-modified polypropylene-based adhesive agent | ○ | Δ | ○ | X |
| Comp. Ex. 3 | Maleic acid-modified polypropylene-based adhesive agent | Maleic acid-modified polypropylene-based adhesive agent | ○ | X | X | X |

Note that "HDI" in Table 1 denotes hexamethylene diisocyanate, "IPDI" denotes isophorone diisocyanate, "MDI" denotes diphenylmethane-4,4'-diisocyanate, and "TDI" denote tolylene diisocyanate As is clear from Table 1, in Examples 1 and 2, "○" rating was obtained in all of the repeated pressure resistance test, high-temperature pressure resistance test, and lamination strength test at high temperatures, and it is understood that the heat resistance, the anti-freeze resistance, the water-resistant, and the durability are excellent.

On the other hand, in Comparative Examples 1 to 3, "○" rating was not obtained in all of the repeated pressure resistance test, high temperature pressure resistance test, and lamination strength test at high temperatures, and it was found that adequate heat resistance, LLC (anti-freeze) resistance, water-resistant, and durability were not obtained.

INDUSTRIAL APPLICABILITY

The heat exchanger according to the present invention can be used as a heater (heating device) used for floor heating and snow removal, in addition to a cooler (cooling device) used for battery countermeasures of a CPU of a smartphone and a personal computer, countermeasures of a liquid crystal TV, an organic EL (electroluminescent) TV, and a plasma TV, and countermeasures of a power module for an automobile, and battery.

This application claims priority to Japanese Patent Application No. 2020-084937 filed on May 14, 2020, the disclosure of which is incorporated herein by reference in its entirety.

The terms and expressions used herein are for illustration purposes only and are not used for limited interpretation, do not exclude any equivalents of the features shown and stated herein, and it should be recognized that the present invention allows various modifications within the scope of the present invention as claimed.

DESCRIPTION OF SYMBOLS

1: Heat exchange
2: Outer packaging member
24: Heat transfer medium inlet
25: Heat transfer medium outlet
3: Inner core member
35: Recess
36: Protrusion
4: Header 51, 61: Heat transfer layer
52: Inner adhesive agent layer
53, 62: Thermal fusion layer
55: Protective layer
L1: Outer packaging laminate material
L2: Inner core laminate material

The invention claimed is:

1. A heat exchanger comprising:
an outer packaging member provided with a heat transfer medium inlet and a heat transfer medium outlet, the outer packaging member being configured to allow a heat transfer medium flowed to an inside of the outer packaging member from the heat transfer medium inlet to pass through the inside and flow out from the heat transfer medium outlet,
wherein the outer packaging member is made of outer packaging laminate materials each including a metal heat transfer layer and a resin thermal fusion layer provided on one surface of the heat transfer layer, the outer packaging laminate materials being superimposed one on the other, the thermal fusion layers being integrally bonded along peripheral edge portions of the outer packaging laminate materials,
wherein the heat transfer layer and the thermal fusion layer of the outer packaging laminate material are laminated via an inner adhesive agent layer made of an acid-modified polyolefin-based adhesive agent containing an acid-modified polyolefin-based resin, and
wherein the acid-modified polyolefin-based adhesive agent comprises a polyolefin resin having a carboxyl group as a main agent and a polyfunctional isocyanate compound as a curing agent.

2. The heat exchanger as recited in claim 1, wherein a ratio of the number of isocyanato groups contained in the polyfunctional isocyanate compound to the number of carboxyl groups contained in the polyolefin resin is 1 to 20.

3. The heat exchanger as recited in claim 1, wherein the polyfunctional isocyanate compound comprises aliphatic isocyanate and aromatic isocyanate.

4. The heat exchanger as recited in claim 1,
wherein the inner adhesive agent layer contains one or more metal salts composed of at least one kind of metal of Groups 7, 12, and 14.

5. The heat exchanger as recited in claim 1,
wherein a protective layer is laminated on the other surface of the heat transfer layer of the outer packaging member.

6. The heat exchanger as recited in claim 1, further comprising:
an inner core member arranged inside the outer packaging member,
wherein the inner core member is composed of an inner core laminate material including a metal heat transfer layer and a resin thermal fusion layer provided on both sides of the heat transfer layer, the inner core member having a concave-convex portion,
wherein the thermal fusion layers of a concave bottom surface and a convex top surface of the inner core member and the thermal fusion layer of the outer packaging member are integrally bonded, and
wherein the thermal fusion layer of the outer packaging member and the thermal fusion layer of the inner core member are composed of the same kind of resin.

* * * * *